United States Patent [19]
Nihira et al.

[11] Patent Number: 5,100,813
[45] Date of Patent: * Mar. 31, 1992

[54] METHOD OF MANUFACTURING BIPOLAR TRANSISTOR

[75] Inventors: Hiroyuki Nihira, Ayase; Nobuyuki Itoh, Tokyo, both of Japan

[73] Assignee: Kabushiki Kaisha Toshiba, Kawasaki, Japan

[*] Notice: The portion of the term of this patent subsequent to Mar. 13, 2007 has been disclaimed.

[21] Appl. No.: 467,366

[22] Filed: Jan. 19, 1990

Related U.S. Application Data

[63] Continuation of Ser. No. 225,804, Jul. 29, 1988, Pat. No. 4,908,324.

[30] Foreign Application Priority Data

Jul. 29, 1987 [JP] Japan ............................ 62-189419
Oct. 27, 1987 [JP] Japan ............................ 62-269259

[51] Int. Cl.$^5$ ............................................ H01L 21/328
[52] U.S. Cl. .................................... 437/31; 437/162; 437/228; 148/DIG. 124
[58] Field of Search ............. 437/31, 32, 33, 162, 437/228, 238, 239; 357/34; 148/DIG. 124

[56] References Cited

U.S. PATENT DOCUMENTS 4,693,782  9/1987  Kikuchi et al. .................. 437/33
4,780,427  10/1988 Sakai et al. ..................... 437/162
4,908,324  3/1990  Nihira et al. .................... 437/31

FOREIGN PATENT DOCUMENTS 58-7862  1/1983  Japan .

OTHER PUBLICATIONS

IEEE Transactions on Electron Devices, vol. ED.33, No. 4, Apr. 1986, Shinsuke Konaka et al., "30-ps Si Bipolar IC Using Super Self-Aligned Process Technology" pp. 526-531.
ISSCC 87/Wednesday, Feb. 25, 1987/Rhinelander South/WAM 4.4, 1987, "Session IV: High-Speed Circuit Technology" pp. 58-59.

*Primary Examiner*—T. N. Quach
*Attorney, Agent, or Firm*—Oblon, Spivak, McClelland, Maier & Neustadt

[57] ABSTRACT

A method of manufacturing a bipolar transistor. A first mask material film pattern is formed on an internal base region prospective portion on a collector region of a first conductive type, and then a first conductive film is deposited. A recess around the projection of the mask film pattern are transferred on the surface of the first conductive film. After a second mask material film pattern is buried in the recess, the first conductive film is selectively etched using the second mask material pattern as a mask, thereby exposing the first mask material film pattern. The first conductive film is continuously, selectively etched by anisotropic etching using the exposed first mask material film pattern and the second mask material film pattern as etching masks to form a first opening between the two mask material film patterns. An impurity of a second conductivity type is doped in the wafer through the first opening to form an external base region of the second conductivity type. The first opening is buried with a second conductive film bfore or after formation of the external base region. The first mask material film pattern is removed to form a second opening. After a thermal oxide film is formed on the surface of the second conductive film, an impurity of the second conductivity type is doped in the wafer through the second opening, thereby forming the internal base region. An impurity of the first conductivity type is doped in the wafer through the second opening to form an emitter region.

10 Claims, 16 Drawing Sheets

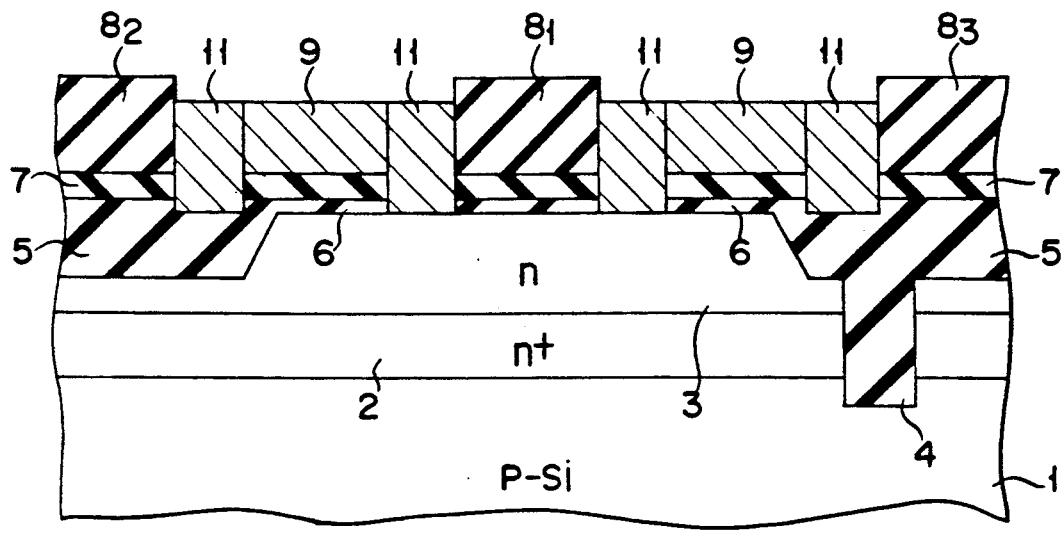
F I G. 3E
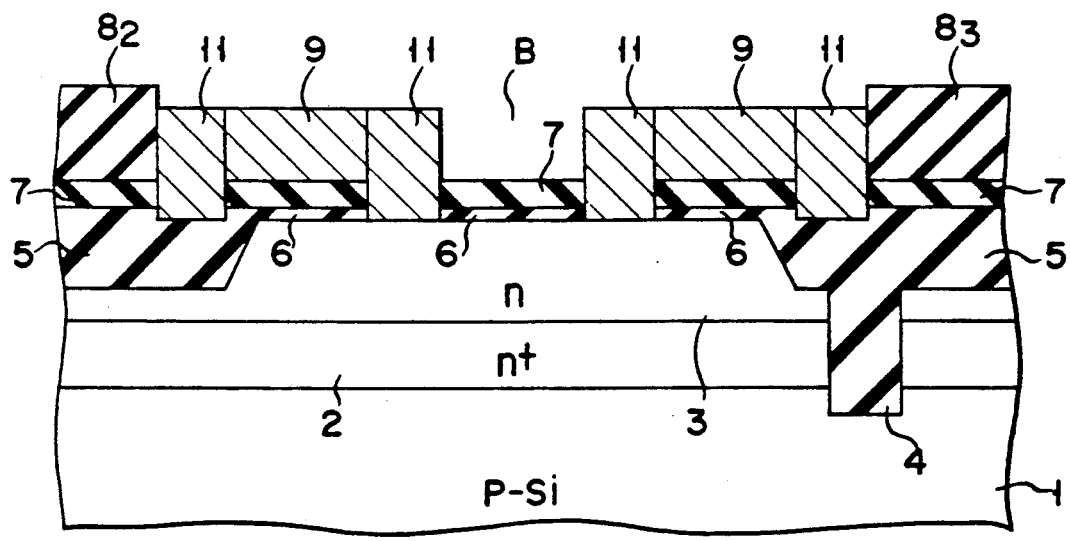
F I G. 3F

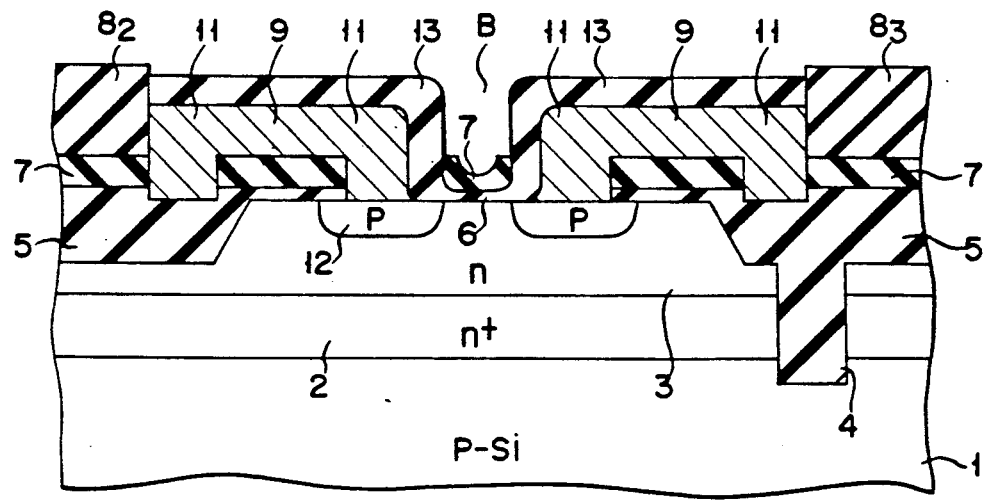
F I G. 3G
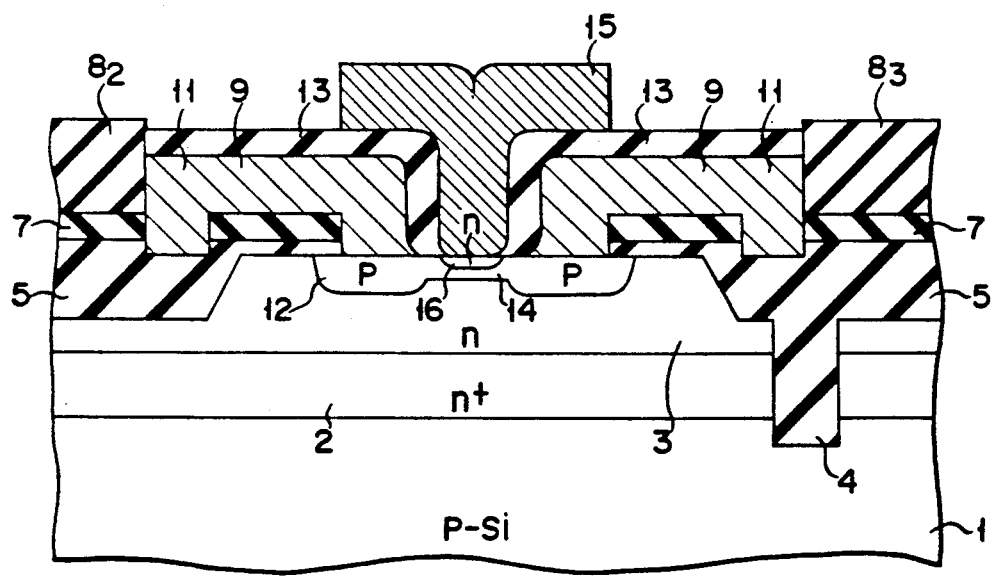
F I G. 3H

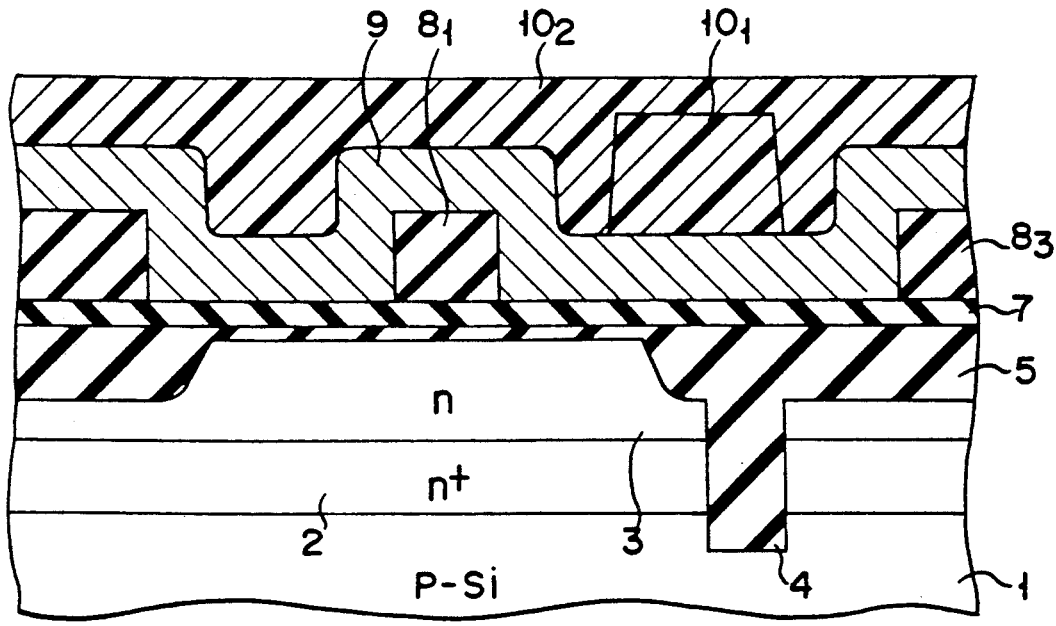
F I G. 4
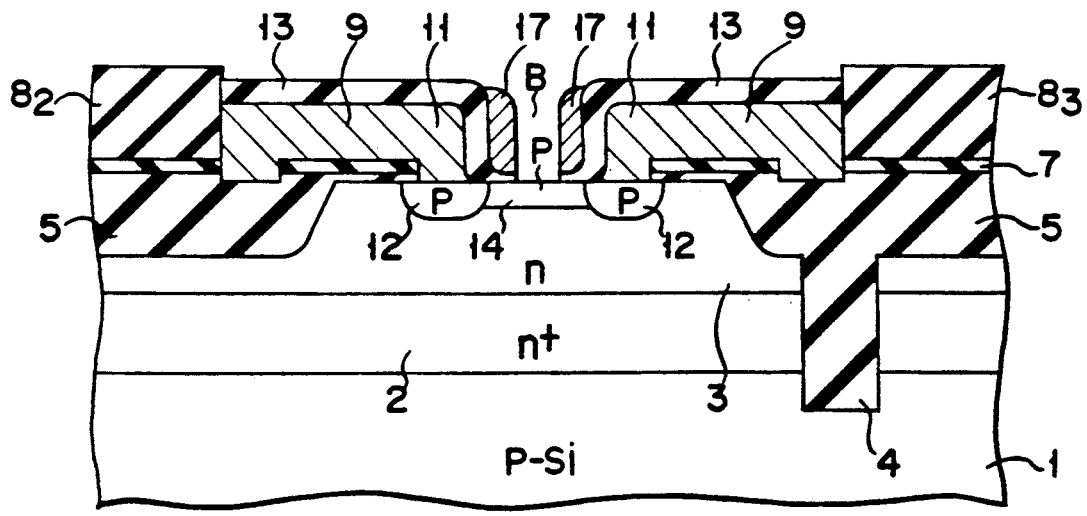
F I G. 5

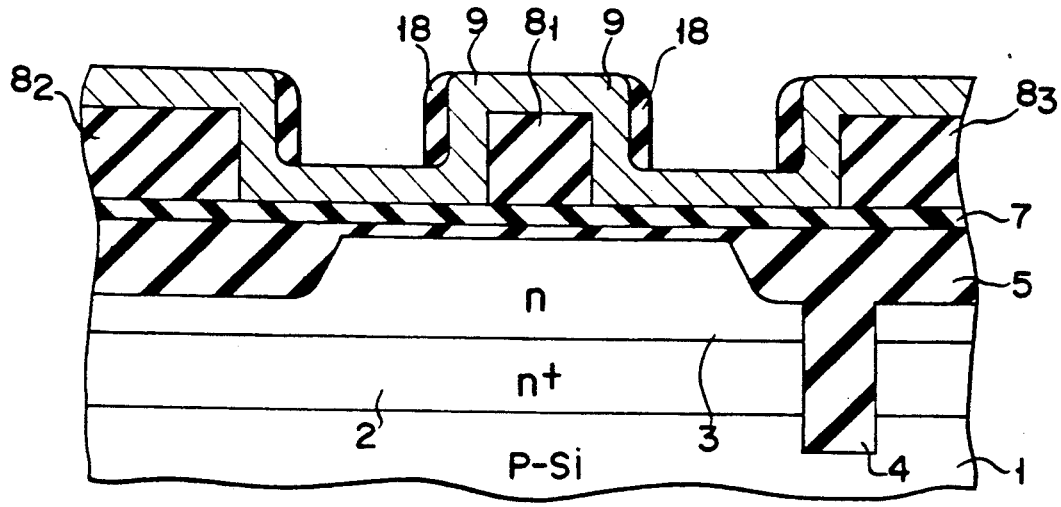
F I G. 6A
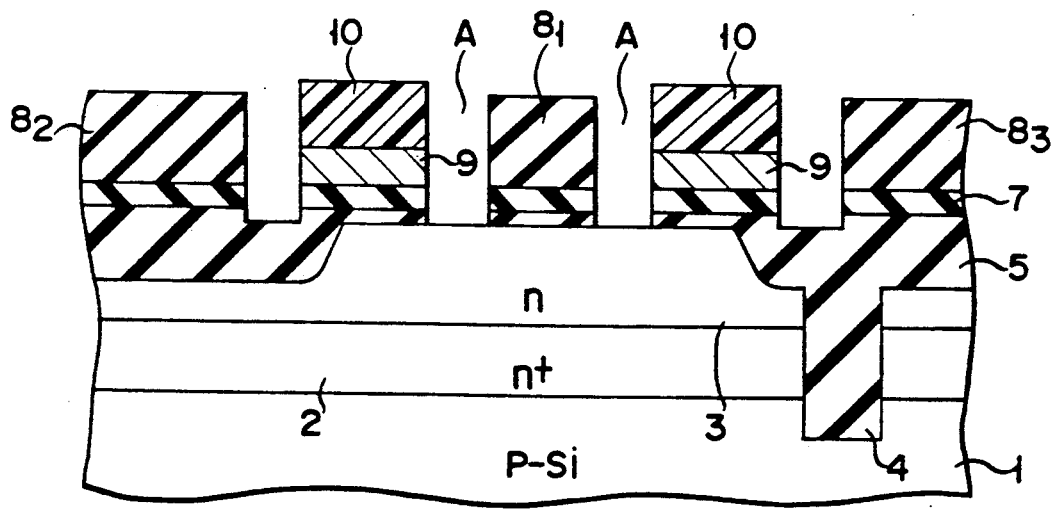
F I G. 6B

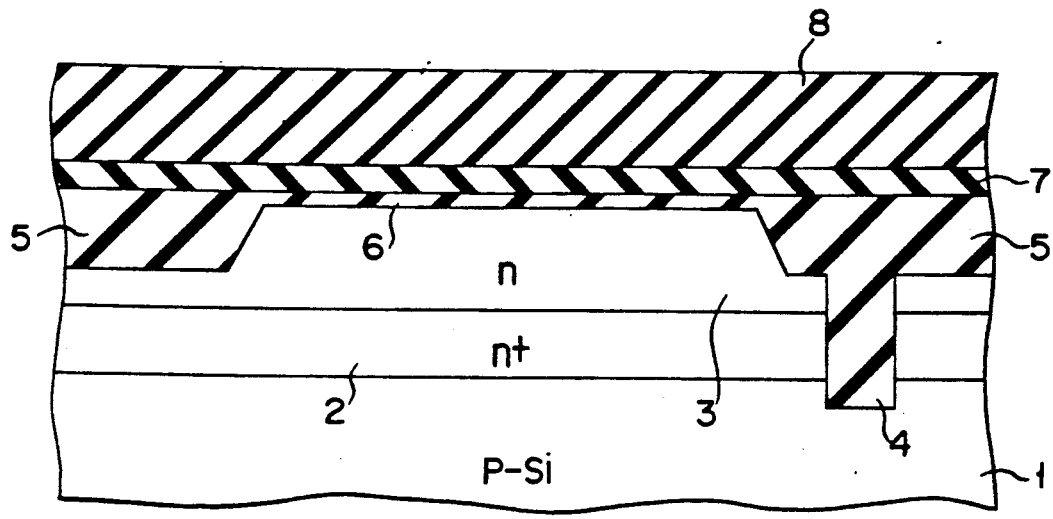
F I G. 8A
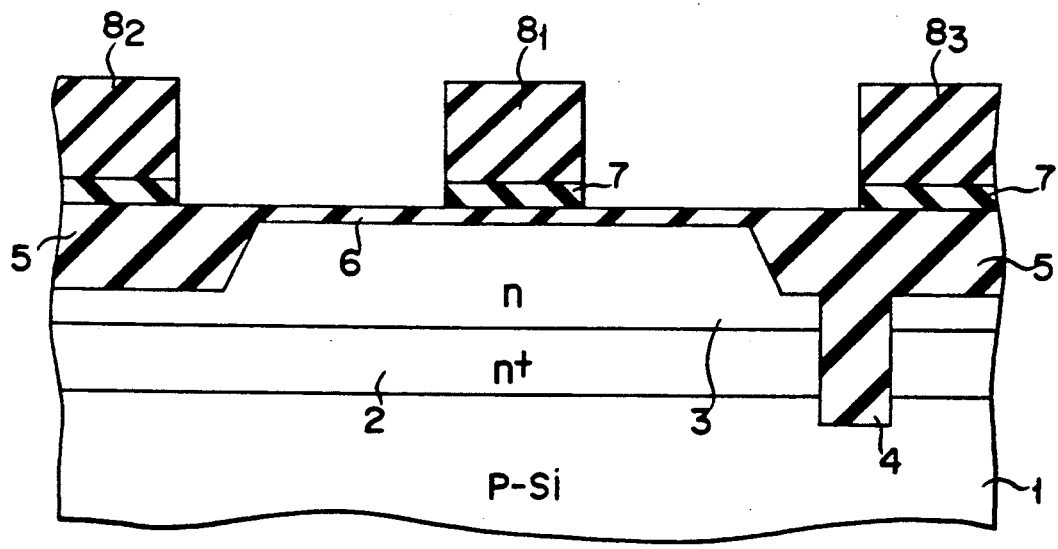
F I G. 8B

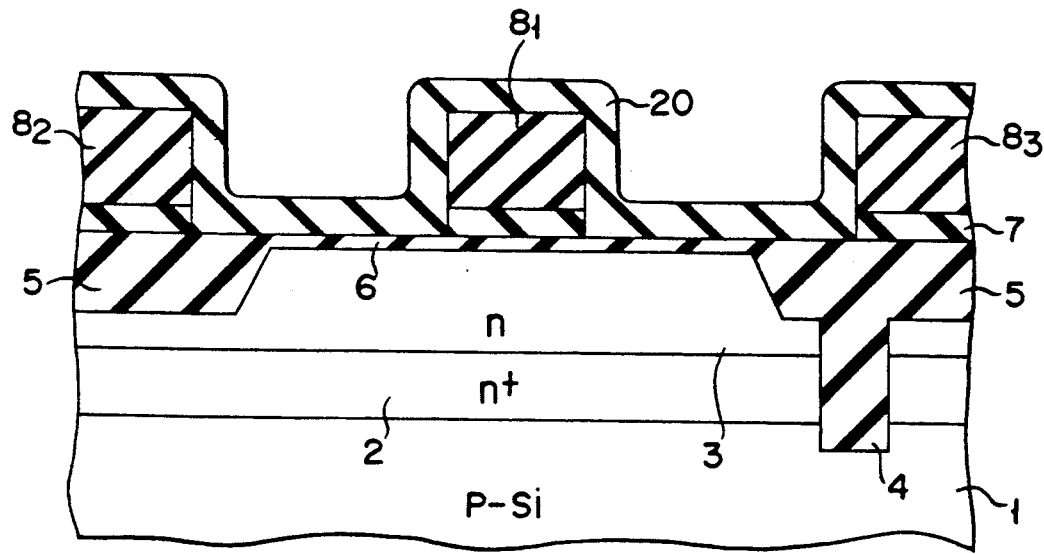
F I G. 8C
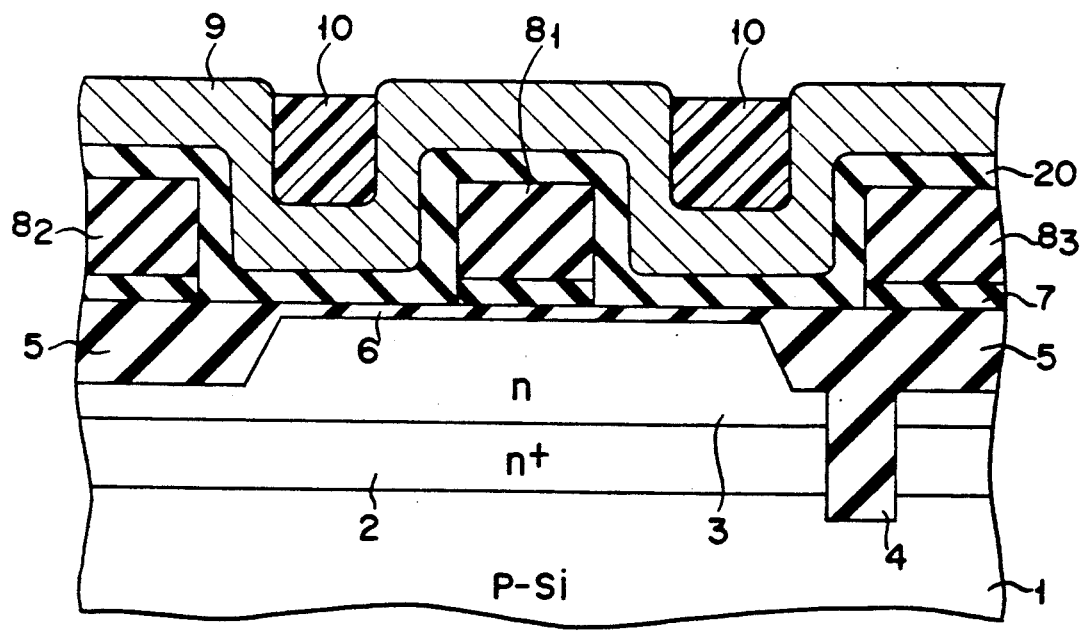
F I G. 8D

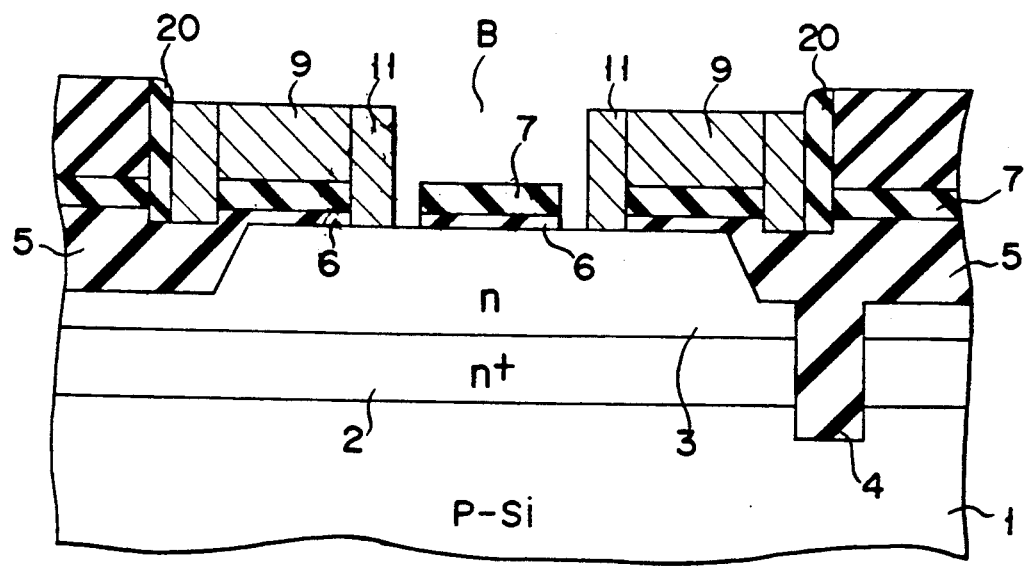
F I G. 8G
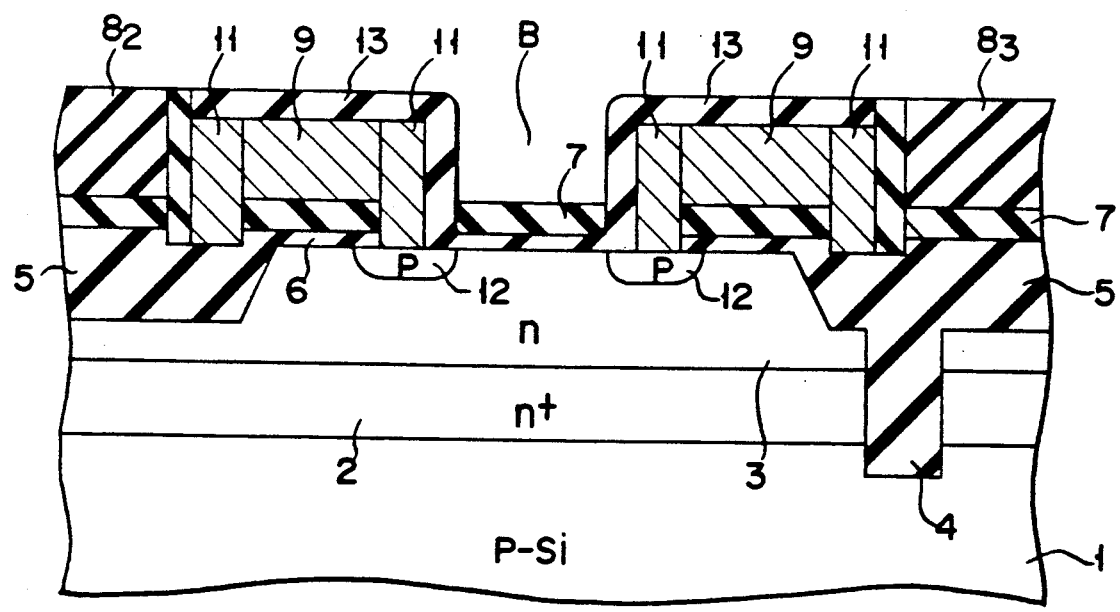
F I G. 8H

METHOD OF MANUFACTURING BIPOLAR TRANSISTOR

This is a continuation of application Ser. No. 07/225,804, filed on Jul. 29, 1988, now U.S. Pat. No. 4,908,324.

BACKGROUND OF THE INVENTION

1. Field of the Invention

The present invention relates to a method of manufacturing a high-performance ultra-miniaturized bipolar transistor and, more particularly, to a method of forming a base region and an emitter region by self alignment.

2. Description of the Prior Art

A high performance bipolar transistor is required in various fields such as computers, optical communication, and various analog circuits Especially, an ultra-miniaturized bipolar transistor which has a high cut-off frequency and can be integrated in an LSI is required.

In order to manufacture the above ultra-miniaturized bipolar transistor, several techniques for forming a base region and an emitter region by self alignment have been recently proposed Cut-off frequencies of bipolar transistors manufactured by these techniques almost reach 30 GHz.

(1) IEEE Trans on Electron Devices, Vol. ED-33, No. 4, Apr. 1986, p. 526,
(2) Japanese Patent Disclosure (Kokai) No. 58-7862,
(3) ISSCC87, 1987, p. 58.

Typical conventional techniques and their problems will be described below

FIGS. 1A to 1D show manufacturing steps in one conventional technique. As shown in FIG. 1A, a wafer has n+-type buried region 22 formed on p-type Si substrate 21 and n-type epitaxial layer 23 formed thereon. P-type channel stopper region 24 is formed in element isolation region of the wafer, and field oxide film 25 is formed by selective oxidation. Thin thermal oxide film 26 is formed on the surface of an element region of the wafer, nitride film ($Si_3N_4$ film) 27 serving as an anti-oxidation mask is deposited, and then first polycrystalline silicon film 28 is deposited. Subsequently, film 28 is selectively, thermally oxidized to change an unnecessary portion on the element isolation region into oxide film 29. Then, boron is doped in film 28 by ion implantation. Thereafter, film 28 is selectively etched by photoetching to form an opening in an emitter formation region as shown in FIG. 1A.

Then, as shown in FIG. 1B, the resultant structure is heat-treated in an oxygen atmosphere to form oxide film 30 on the surface of film 28, and then film 27 at the opening portion is etched by a heated aqueous phosphoric acid solution, using film 30 as a mask. Thereafter, exposed film 26 is removed by an aqueous $NH_4F$ solution to expose the wafer surface. At this time, by intentionally over-etching film 27, overhang portion 31 is formed along an edge of film 28 as shown in FIG. 1B.

Then, second polycrystalline silicon film 32 is deposited on the entire surface, and embedded in overhang portion 31. Subsequently, the second polycrystalline film 32 is etched, thereby exposing the oxide film 30 and the surface of the wafer in the opening, as shown in FIG. 1C.

Then, the exposed wafer surface and a side surface of film 32 as shown in FIG. 1C, are thermally oxidized to form thermal oxide film 33, as shown in FIG. 1D. During thermal oxidation, the boron doped in film 28 is diffused into the wafer through film 32, thereby forming p-type external base region 34. Subsequently, boron is ion-implanted through the opening portion to form p-type internal base region 35. Thereafter, CVD insulating film 36 and third polycrystalline silicon film 37 are deposited and then etched back by reactive ion etching so that films 36 and 37 remain on side walls of the opening portion. Then, film 33 on the wafer surface at the opening portion is etched using residual film 37 as a mask to expose the wafer surface. Thereafter, fourth polycrystalline silicon film 38 doped with arsenic having a high concentration is deposited and annealed. At this time, the arsenic in film 38 is diffused into the wafer to form n-type emitter region 39, thereby obtaining a bipolar transistor shown in FIG. 1D. Note that first and second polycrystalline silicon films 28 and 32 are used as a base electrode, and fourth polycrystalline silicon film 38 is used as an emitter electrode.

According to the above method shown in FIGS. 1A to 1D, the base and emitter regions are formed by self alignment. In addition, since a structure is miniaturized, i.e., the width of an emitter diffusion window is as small as 0.35 μm, a bipolar transistor having excellent high-speed operation characteristics can be obtained. However, according to this method, it is difficult to control the size of overhang portion 31 in FIG. 1B. That is, in a step of etching nitride film 27 by an aqueous phosphoric acid solution to form overhang portion 31, it is difficult to control conditions such as a temperature, a concentration of the phosphoric acid, and a stirring state. For this reason, the size of overhang portion 31 varies in different wafers and in each individual wafer, resulting in variations in element characteristics.

In the step of FIG. 1C, when second polycrystalline film 32 is etched to be buried below overhang portion 31, the wafer surface formed also of silicon is simultaneously etched. Therefore, the wafer surface of the emitter region is damaged. In addition, the width of the polycrystalline silicon film (which largely affects the width of the external base region) to be buried below the overhand portion varies, resulting in variations in characteristics such as a breakdown voltage and a cut-off frequency.

FIGS. 2A to 2D show manufacturing steps of another conventional method. In this method, as shown in FIG. 2A, n+-type buried region 42 is formed on p-type Si substrate 41 to grow n-type epitaxial layer 43. P-type channel stopper region 44 is formed in an element isolation region, and thick field oxide film 45 is formed. The above steps are the same as in the above conventional method. Thereafter, nitride film 46 serving as an anti-oxidation mask and CVD oxide film 47 are sequentially deposited on the entire surface and patterned so that films 46 and 47 remain in an emitter region of an element and the element isolation region.

Then, as shown in FIG. 2B, first polycrystalline silicon film 48 is deposited on the entire surface, and boron is ion-implanted in film 48. Subsequently, thick photoresist film 49 is formed on the surface of film 48, and the entire surface is flattened. Thereafter, the thick photoresist film is etched back. As a result, as shown in FIG. 2B, film 48 on film 47 is exposed, and photoresist 49 is buried in the recess of film 48.

Then, film 48 is etched using photoresist 49 as a mask to expose the surface of film 47. Thereafter, CVD insulating film 471 at a portion serving as an emitter region is removed, and thermal oxidation is performed using film 46 as a mask, thereby forming oxide film 50 on the surface of film 48. At the same time, the boron in film 48 is thermally diffused into the wafer to form p-type layer 51 serving as an external base region as shown in FIG. 2C.

Thereafter, film 46 is removed by a heated aqueous phosphoric acid solution to form an emitter opening portion. Then, as shown in FIG. 2D, second polycrystalline silicon film pattern 53 for burying the emitter opening portion is formed. Boron is ion-implanted in film 53 at a high concentration and annealed, thereby diffusing the boron into the wafer to form internal base layer 52. Then, arsenic is ion-implanted in film 53 at a high concentration and annealed, thereby diffusing the arsenic into the wafer to form n-type emitter layer 54. As a result, an npn transistor is completed.

In the conventional method shown in FIGS. 2A to 2D, unlike in the conventional method shown in FIGS. 1A to 1D, ho overhang portion is formed and therefore a polycrystalline silicon film is not buried below the overhang portion, i.e., manufacturing steps difficult to be controlled are not present. In addition, the emitter and internal base layers can be formed by self alignment.

However, according to the conventional method shown in FIGS. 2A to 2D, a relationship between external base region 51 and emitter region 54 cannot be completely defined by self alignment. This is because a portion from CVD insulating film 47₁ which defines the emitter region to insulating film 45 is entirely the external base region as shown in FIG. 2C. Therefore, if mask alignment for forming CVD insulating films 47₁ to 47₃ is offset in FIG. 1A, widths of external base region 51 differ from each other at right and left sides of emitter region 54, resulting in variations in the element characteristics. In addition, in order to form CVD insulating film 47₁ for defining the emitter region, a mask alignment margin must be assured in a photolithography step. For this reason, the external base region is enlarged to increase the size of the element as a whole. As a result, an unnecessary stray capacitance or parasitic resistance is increased.

As described above, according to the conventional methods of manufacturing a high-performance bipolar transistor, it is difficult to control formation of an overhang portion, or self alignment is incomplete. Therefore, a bipolar transistor which stably performs a high-speed operation cannot be obtained.

SUMMARY OF THE INVENTION

It is, therefore, an object of the present invention to provide a method of manufacturing a bipolar transistor, which solves the above-described prior art problems.

The above object of the present invention is achieved by a method of manufacturing a bipolar transistor, comprising the following steps a) to l):

a) forming an insulating film on a semiconductor wafer having a collector region of a first conductivity type;

b) depositing a first mask material film on the insulating film, and patterning the first mask material film, thereby forming a first mask material film pattern covering an internal base region prospective portion, the first mask material film pattern having a step at its end portion with respect to a surrounding wafer surface;

c) depositing a conductive material on the surface to cover the first mask material film pattern, thereby forming a first conductive film to be used as a part of a base electrode, the surface of the first conductive film having a recess at a position spaced apart from a side end of the first mask material film pattern in a transverse direction by a distance corresponding to the film thickness of the first conductive film;

d) burying a second mask material film pattern in the recess of the first conductive film surface;

e) selectively etching the first conductive film using the second mask material film pattern as an etching mask to expose the first mask material film pattern;

f) continuously, selectively etching the first conductive film by etching using the exposed first mask material film pattern and the second mask material film pattern as etching masks, thereby forming a first opening for forming an external base region between the two mask material film patterns;

g) removing the second mask material film pattern;

h) burying a second conductive film serving as a part of a base electrode in the first opening, while doping an impurity of a second conductivity type into the wafer through the first opening to form the external base region of the second conductivity type;

i) removing the first mask material film pattern to form a second opening for forming an internal base region;

j) forming a thermal oxide film on the surface of the second conductive film;

k) doping an impurity of the second conductivity type into the wafer through the second opening to form the internal base region of the second conductivity type; and l) doping an impurity of the first conductivity type into the wafer through the second opening.

According to the method of the present invention, the emitter region and the internal base region are determined by the first mask material film pattern formed in the element region, and the external base region is determined by the first opening. The first opening is defined by the first mask material film pattern and the second mask material film pattern. A distance between the patterns is defined by the film thickness of the first conductive film. Therefore, the external and internal base regions are formed completely by self alignment with respect to the emitter region.

Furthermore, a step of forming an overhang and burying a polycrystalline silicon film therebelow, which is difficult to be controlled, is not necessary. Therefore, size accuracy with small variations can be obtained. Moreover, the width of the external base region can be easily and accurately controlled by selecting the film thickness of the first conductive film. Therefore, according to the present invention, a high-performance bipolar transistor can be obtained.

BRIEF DESCRIPTION OF THE DRAWINGS

FIGS. 3A to 3H are sectional views for explaining an embodiment of a method of manufacturing a bipolar transistor according to the present invention;

FIGS. 4 and 5 are sectional views for explaining other embodiments of the present invention, respectively;

FIGS. 6A and 6B and FIGS. 7A and 7B are sectional views for explaining other embodiments of the present invention, respectively; and FIGS. 8A to 8J are sectional views for explaining a preferred embodiment of the present invention.

DETAILED DESCRIPTION OF THE PREFERRED EMBODIMENTS

FIGS. 3A to 3H are sectional views showing manufacturing steps of a bipolar transistor according to an embodiment of the present invention.

Figure 1A:
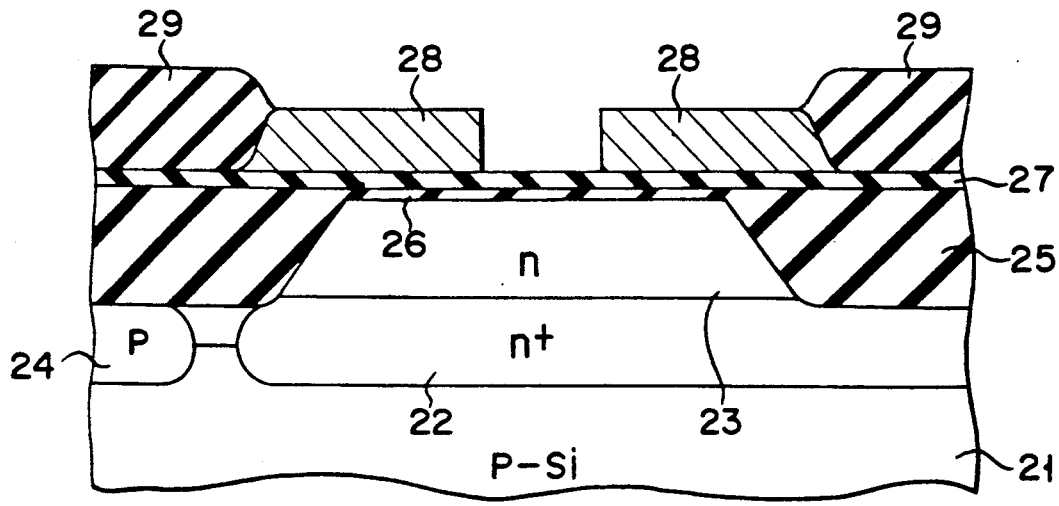
FIGS. 1A to 1D are sectional views showing a conventional method of manufacturing a bipolar transistor.
Figure 1B:
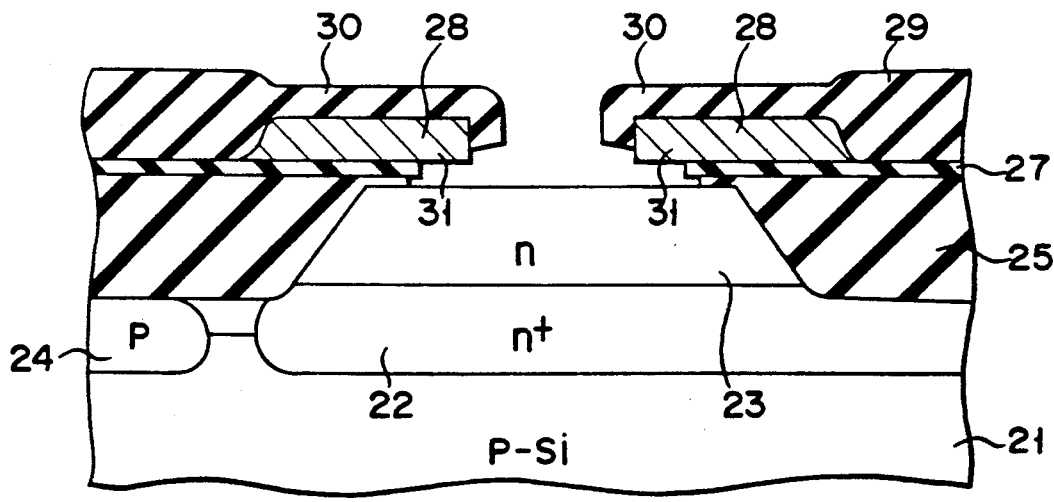
Figure 1C:
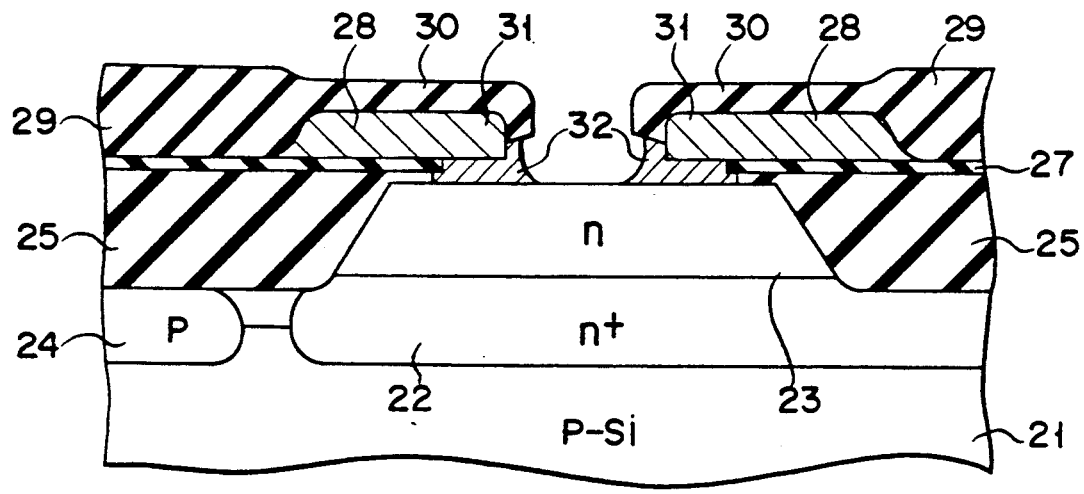
Figure 1D:
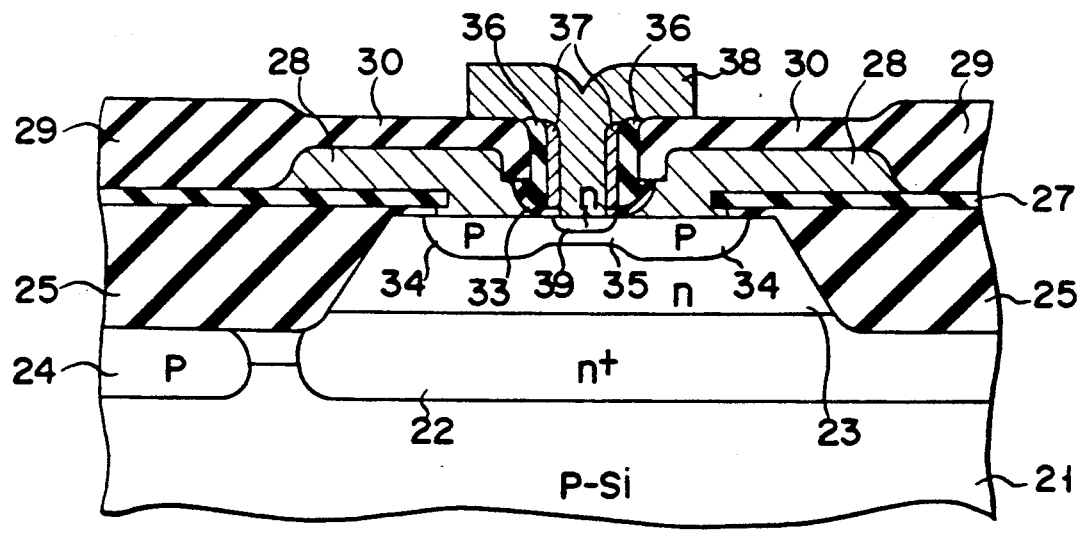
Figure 2A:
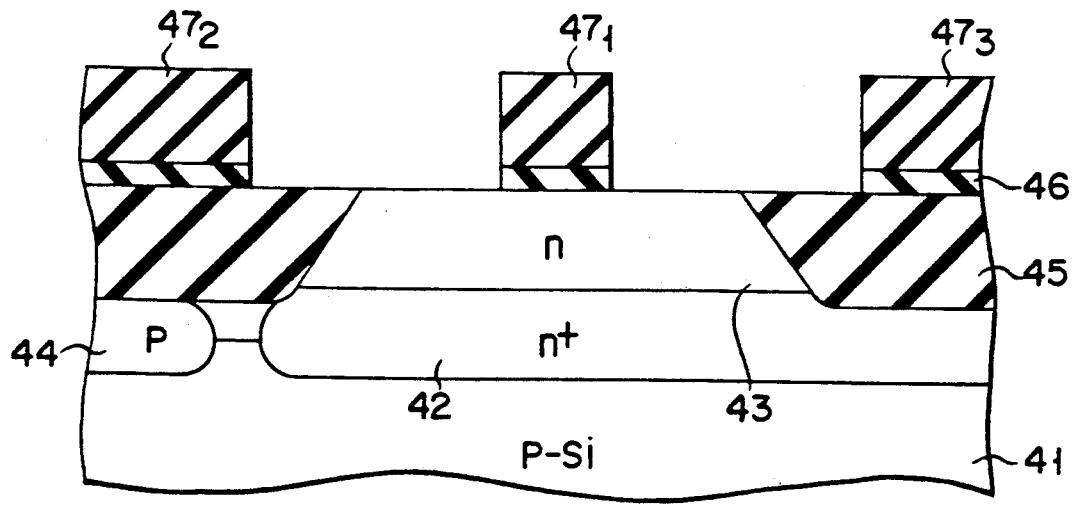
FIGS. 2A to 2D are sectional views showing another conventional method of manufacturing a bipolar transistor.
Figure 2B:
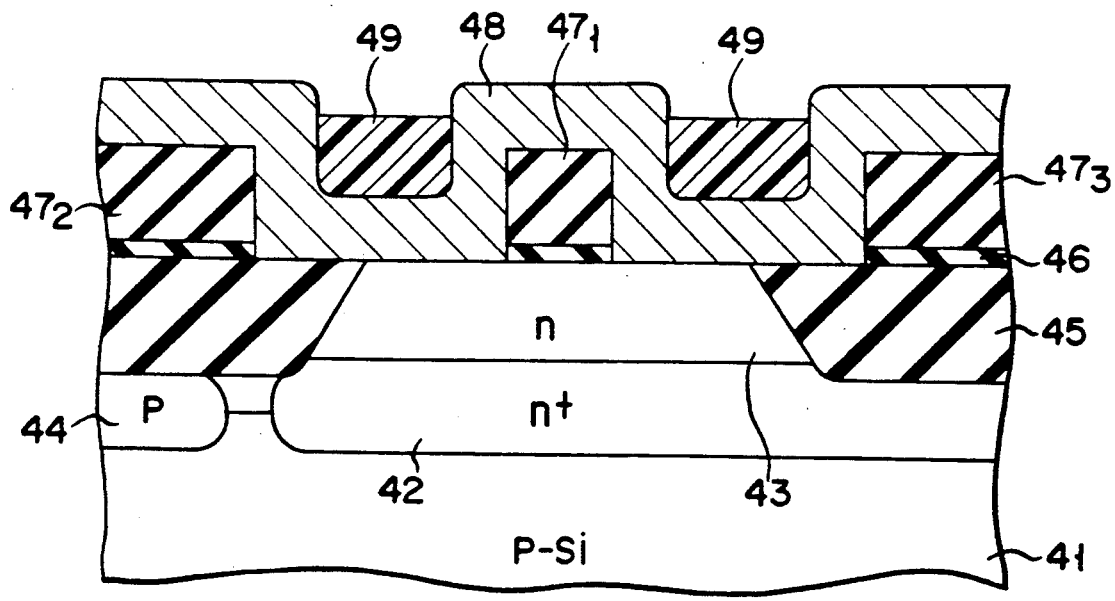
Figure 2C:
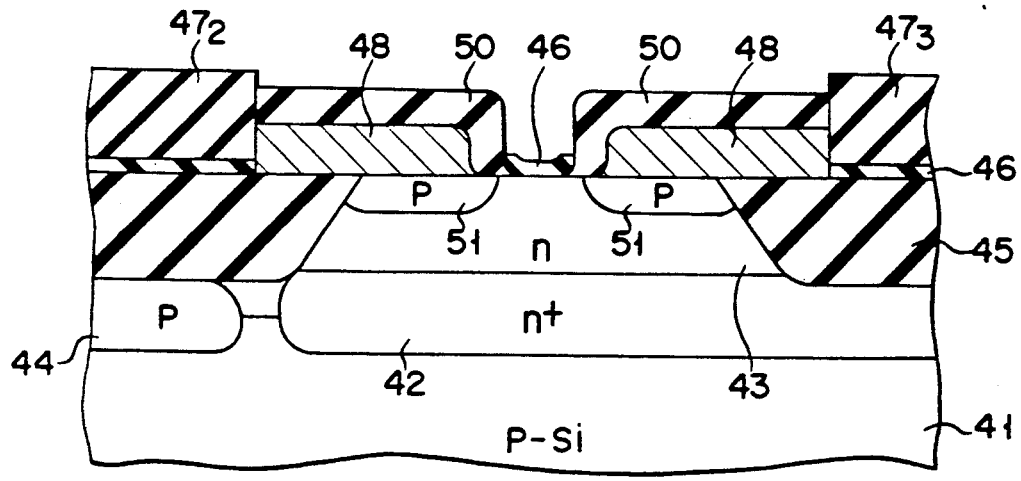
Figure 2D:
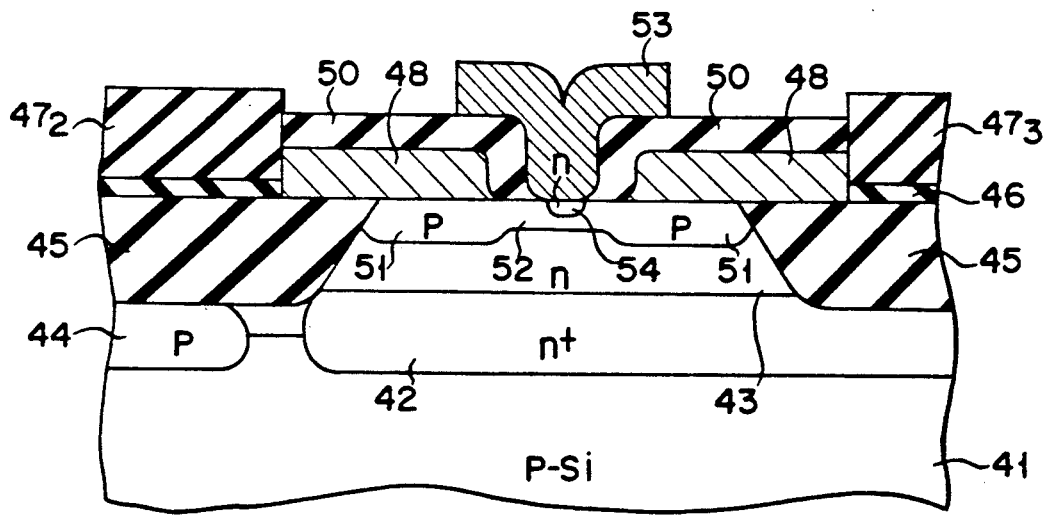
Figure 3A:
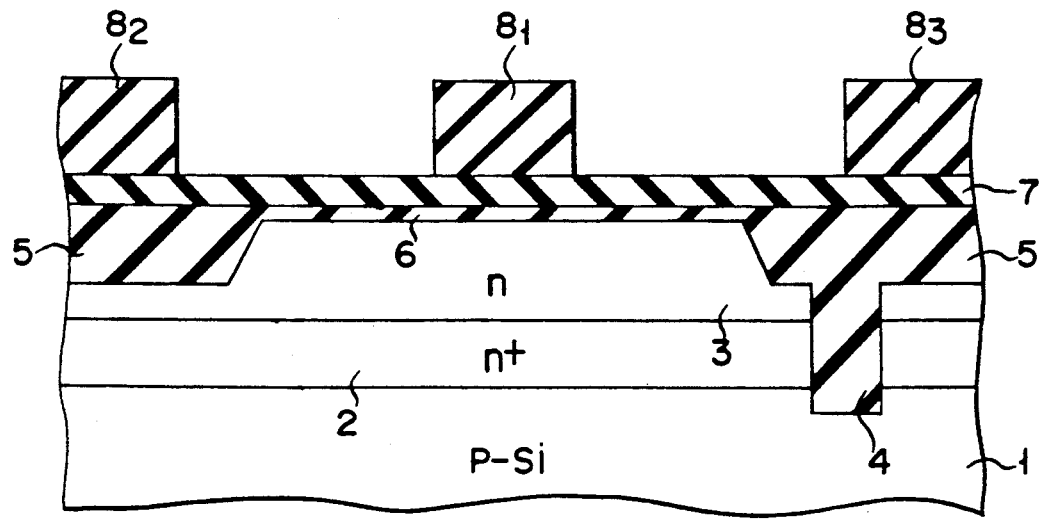

In this embodiment, as shown in FIG. 3A, n$^+$-type buried region 2 is formed on p-type Si substrate 1, and n-type epitaxial layer 3 serving as a collector region is formed thereon. Layer 3 is formed as an n-type layer having an impurity concentration of $1 \times 10^{16}$ atoms/cm$^3$ by a vapor growth method. Subsequently, a groove is formed in an element isolation region of this wafer, and a groove is formed in the element isolation region between a base emitter region and a collector contact region. Thereafter, selective oxidation is performed to form element isolating oxide film 4 and electrode isolating oxide film 5 in the groove. Note that the collector contact region is not shown. Oxide film 6 having a thickness of about 200 Å is formed on the entire surface of the element-isolated wafer by thermal oxidation. Then, silicon nitride film 7 is deposited as an anti-oxidation insulating film to a thickness of about 1,000 Å, and a CVD oxide film 8 is deposited as a first mask material film to a thickness of about 5,000 Å. The CVD oxide film is patterned by photolithography so that oxide film patterns 8$_1$ to 8$_3$ remain on an internal base region prospective portion and the element isolation region (FIG. 3A). At this time, patterning is performed by reactive ion etching (RIE) such that thick oxide film patterns 8$_1$ to 8$_3$ has substantially vertical side walls.

Figure 3B:
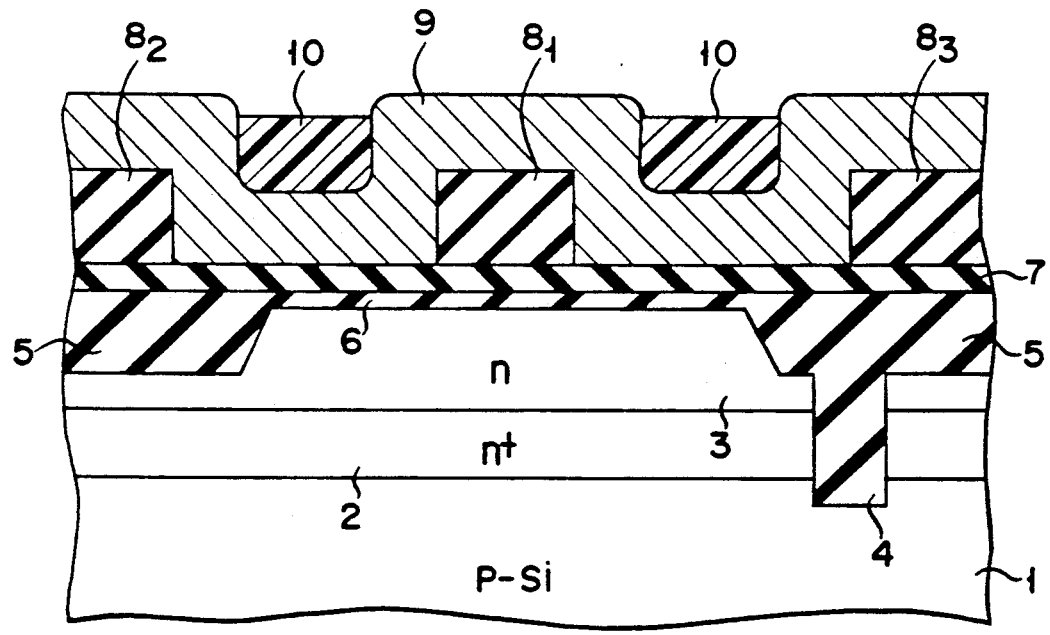

Then, first polycrystalline silicon film 9 is deposited as a first conductive film. The thickness of film 9 is about 3,500 Å. Subsequently, a photoresist is coated on the entire surface as a second mask material film, and the surface is flattened. Thereafter, the resultant structure is etched back in an O$_2$ plasma atmosphere, thereby exposing the surface of film 9 formed on film 8. That is, as shown in FIG. 3B, photoresist pattern 10 is buried in a recess of film 9.

Figure 3C:
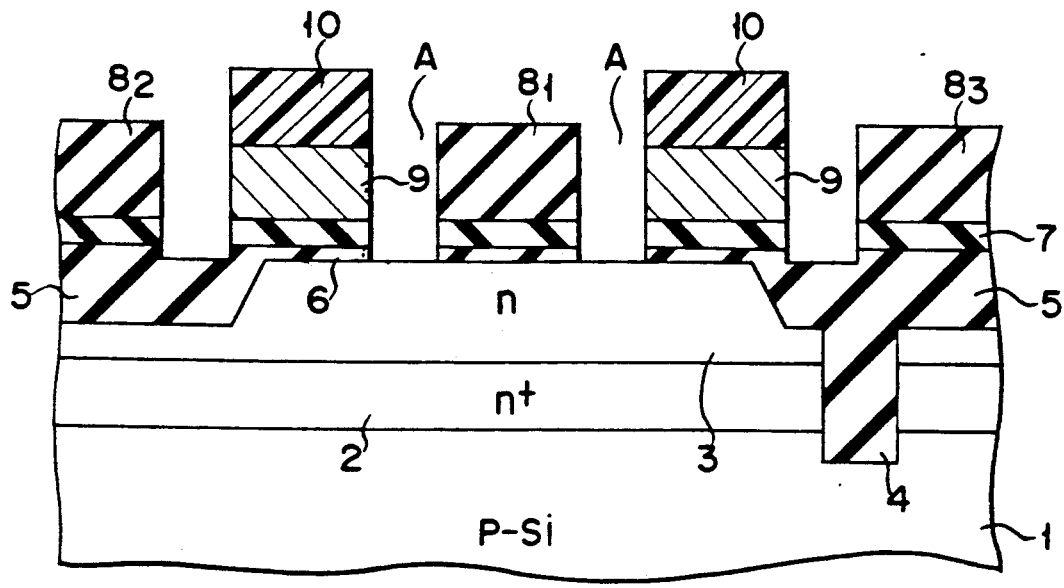

Then, film 9 is etched using pattern 10 as a mask by RIE. After patterns 8$_1$ to 8$_3$ are exposed, these oxide film patterns are also used as a mask together with pattern 10. In this manner, film 9 is continuously etched until it remains below only pattern 10. In addition, exposed film 7 is etched. This etching is performed by RIE so as not to form an overhang. When film 7 is etched to expose film 6, film 6 is etched using an aqueous NH$_4$F solution to expose the wafer surface. In this manner, first opening A for forming an external base region is formed (FIG. 3C). Note that the wafer surface may be exposed by etching using RIE. In either case, a sufficient etching selection ratio of film 6 and layer 3 can be obtained, the wafer is not damaged.

Figure 3D:
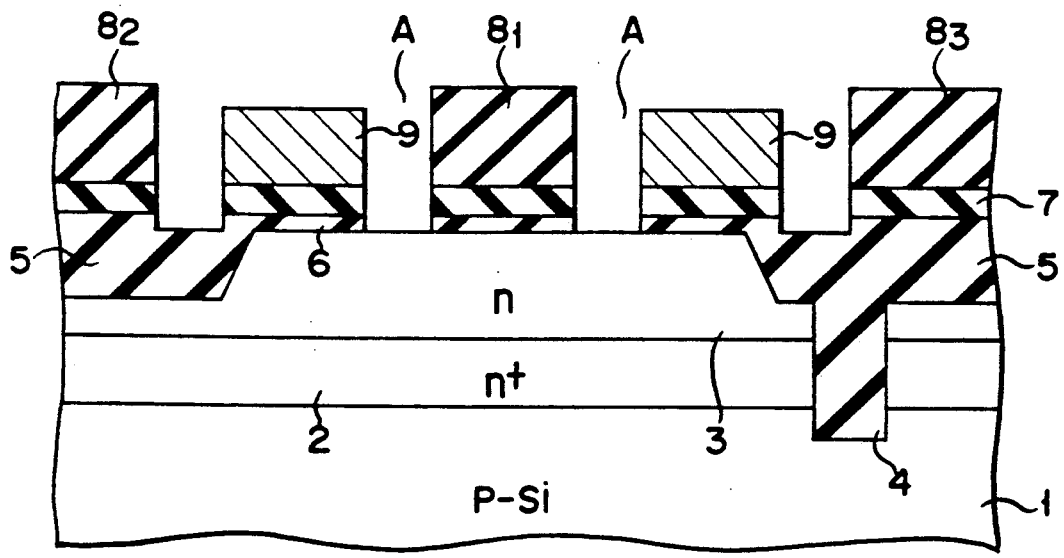

Then, as shown in FIG. 3D, pattern 10 is removed. Subsequently, second polycrystalline silicon film 11 is deposited as a second conductive film to a thickness of about 6,000 Å and then etched back. In this manner, as shown in FIG. 3E, film 11 is buried in opening A while the surface of film 8 is exposed. In addition, the surfaces of residual films 9 and 11 are flattened. The film thickness of film 11 need only be half or more the width of opening A. However, in order to obtain practical flatness, film 11 preferably has the film thickness 1.5 times the width of opening A.

Then, ion implantation is performed to dope boron in film 11. In this case, boron may be doped not only in film 11 but also in film 9. Ion implantation conditions of the boron are given as an acceleration voltage of 50 keV and a dose of $1 \times 10^{16}$ ions/cm$^2$.

Then, CVD oxide film 8$_1$ on an emitter formation region is selectively removed by photolithography to form second opening B for forming an internal base region, as shown in FIG. 3F. Subsequently, the resultant structure is thermally oxidized using exposed film 7 as a mask to form oxide film 13 on the surface of films 9 and 11, as shown in FIG. 3G. In this case, thermal oxidation is wet oxidation performed at a temperature of 800° to 950°, and film 13 having a thickness of about 3,000 Å is formed on the upper and side surfaces of the polycrystalline silicon film. As a result, a contact width between film 11 and the wafer becomes about 2,000 Å. In this thermal oxidation step, the boron doped in film 11 is diffused into the wafer to form p-type external base region 12. If necessary, annealing may be performed in an inert atmosphere such as an N$_2$ gas atmosphere in addition to a thermal oxidation step, thereby controlling a diffusion depth and a impurity concentration of the p-type external base region.

Thereafter, film 7 in opening B is removed by plasma etching, and film 6 below film 7 is removed by an aqueous NH$_4$F solution, thereby exposing the wafer surface in opening B. A thin oxide film having a thickness of about 250 Å is formed on the wafer surface exposed in opening B by thermal oxidation. Then, boron is ion-implanted under the conditions of an acceleration voltage of 15 keV and a dose of $5 \times 10^{13}$ ions/cm$^2$, thereby forming p-type internal base region 14. Subsequently, the oxide film in opening B is removed, and third polycrystalline silicon film 15 is deposited as a third conductive film so as to cover the opening portion. Arsenic is ion-implanted in film 15 under the conditions of an acceleration voltage of 50 keV and a dose of $1 \times 10^{16}$ ions/cm$^2$, and then film 15 is patterned into a shape required as an emitter electrode. Thereafter, the resultant structure is annealed to diffuse the arsenic contained in film 15 into the wafer, thereby forming n-type emitter layer 16 (FIG. 3H).

Thereafter, although not shown, a base contact hole for films 9 and 11 is formed in oxide film 13, and Al wiring of an emitter, a base, and a collector is formed, thereby completing the transistor.

According to the above embodiment, CVD oxide film pattern 8$_1$ formed in the element region is used to form the external base layer having the predetermined width by self alignment around pattern 8$_1$. In addition, the internal base region and the emitter region are sequentially formed by self alignment in regions from which pattern 8$_1$ is removed. That is, these impurity regions are formed completely by self alignment. Especially, first opening A for forming the external base region is formed so as to have a width corresponding to the film thickness of first polycrystalline silicon film 9. Therefore, controllability of the present invention is better than that of the conventional method which utilizes an overhang as shown in FIGS. 1A to 1D. That is, by changing the film thickness of film 9, the width of the external base region can be easily changed.

In the above embodiment, boron is ion-implanted in second polycrystalline silicon film 11, and external base layer 12 is formed using film 11 as a diffusion source. However, such solid-phase diffusion need not be performed. For example, boron may be ion-implanted directly in the wafer in the state of FIG. 3C or 3D to form the external base layer. In this case, an impurity concentration can be increased, and therefore a resistance of the external base region can be reduced.

In addition, in the above embodiment, the internal base region is formed by etching nitride film 7 and oxide film 6 and forming a thin thermal oxide film. However, the internal base region may be formed by ion implantation when film 7 is removed or when film 6 is removed.

Furthermore, in the above embodiment, emitter region 16 is formed by solid-phase diffusion from third polycrystalline silicon film 15. However, region 16 may be formed by ion implantation. In this case, the oxide film used as a buffer layer to form internal base region 14 by ion implantation may be directly used as a buffer layer to perform ion implantation for forming the emitter region therethrough. Alternatively, this oxide film may be removed to perform ion implantation. Moreover, by adjusting an acceleration voltage of ion implantation, ion implantation can be performed through third polycrystalline silicon film 15 for an emitter electrode.

Referring to FIGS. 4 to 7B, other embodiments of the present invention will be described.

FIG. 4 shows another embodiment in which photoresist pattern 10 is buried preferably in a recess of first polycrystalline silicon film 9 if the recess is wide. When the recess of film 9 is wide, it is not easy to flatten the surface even if a photoresist is coated thereon. In this case, as shown in FIG. 4, auxiliary photoresist pattern $10_1$ is formed in advance in the wide (e.g., 3 μm wide or more) recess by normal photolithography. When an actual width of the recess is narrowed in this manner, the entire surface can be easily flattened by coating photoresist $10_2$ thereon.

Note that in either of the embodiments shown in FIGS. 3A to 3H and FIG. 4, ion implantation with respect to the photoresist film is effective. This is because the photoresist film is hardened by ion implantation, and an anti-etching property required for an etching mask is improved. Note that an ion seed used for this purpose is not limited. Examples of the ion seed are $B^+$, $P^+$, $As^+$, and $Ar^+$.

FIG. 5 shows still another embodiment in which the width of an emitter region is reduced. For example, in order to increase an emitter breakdown voltage, a relationship between an external base region size and an emitter region size must be sometimes controlled. In order to reduce an emitter junction capacitance or to suppress an emitter-clouding effect, the width of an emitter region must be sometimes reduced. This embodiment is effective in these cases. In this embodiment, after internal base region 14 is formed, polycrystalline silicon film 17 is selectively left on side walls of second opening B to narrow the opening. This state is obtained by depositing a polycrystalline silicon film having a predetermined thickness and etching the entire surface by RIE, after performing ion implantation for forming region 14. If necessary, the polycrystalline silicon film and a CVD oxide film are stacked, and these stacked films are left on the side wall of opening B. In this case, a smaller opening for emitter diffusion is obtained. In addition, if a material having a small specific dielectric constant is selected as a material to be left on the side wall of the second opening, an emitter-base stray capacitor can be reduced.

FIGS. 6A and 6B show still another embodiment in which a degree of freedom for controlling the width of an external base region is improved. In this embodiment, after first polycrystalline silicon film 9 is deposited on the entire surface as in the embodiment shown in FIGS. 3A to 3H, spacer film 18 consisting of a CVD oxide film is formed on side walls of the step of film 9 as shown in FIG. 6A. Film 18 is formed by depositing the CVD oxide film on the entire surface and etching-back the film by RIE.

Thereafter, first opening A for forming an external base region is formed as follows. First, as in the embodiment shown in FIGS. 3A to 3H, photoresist 10 is buried in a recess. CVD oxide film 18 is etched and removed by an aqueous NH$_4$F solution using photoresist 10 as a mask. Then, polycrystalline silicon film 9 is etched by RIE using photoresist 10 .and CVD oxide film 8. Subsequently, nitride film 7 and oxide film 6 are sequentially etched in the same manner as in the embodiment of FIGS. 3A to 3H, thereby forming first opening A for forming an external base (FIG. 6B).

As described above, in the embodiment shown in FIGS. 6A and 6B, the width of first opening A (i.e., the width of the external base region) is determined by a sum of the film thickness of first polycrystalline silicon film 9 and that of spacer film 18. Therefore, if necessary, the width of the external base region can be arbitrarily set without depending on the film thickness of film 9. Note that in addition to the CVD oxide film, various films can be used as film 18.

In the above embodiments, the polycrystalline silicon film is used as the first to third conductive films. However, if the films are not used as a solid-phase diffusion source of an impurity, other conductive materials may be used. In this case, however, a material for the second conductive film is selected such that a thermal oxide film can be formed on the surface thereof. Examples of the material capable of forming a thermal oxide film are refractory metal silicides such as molybdenum silicide, tungsten silicide, and tantalum silicide. As the first conductive film, a refractory metal film of molybdenum or tantalum not capable of forming a good thermal oxide film can also be used.

Figure 7A:
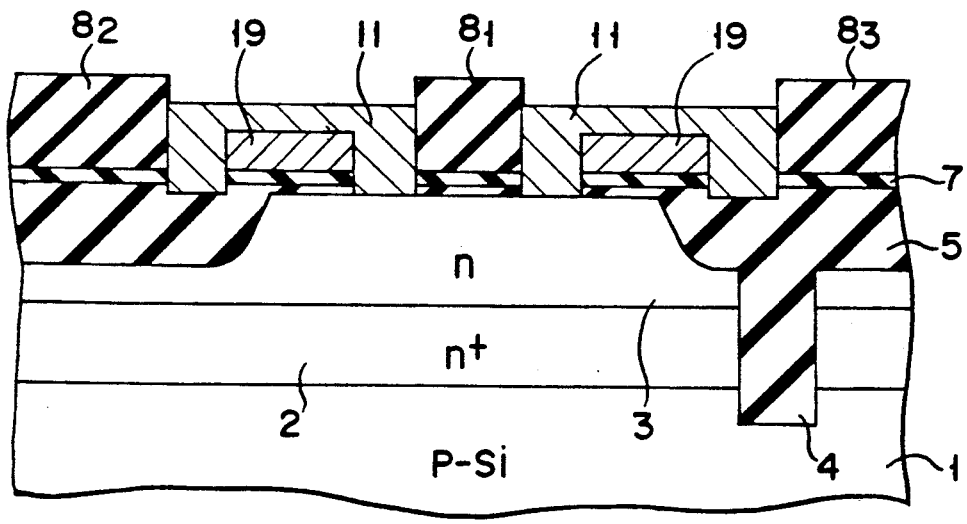
Figure 7B:
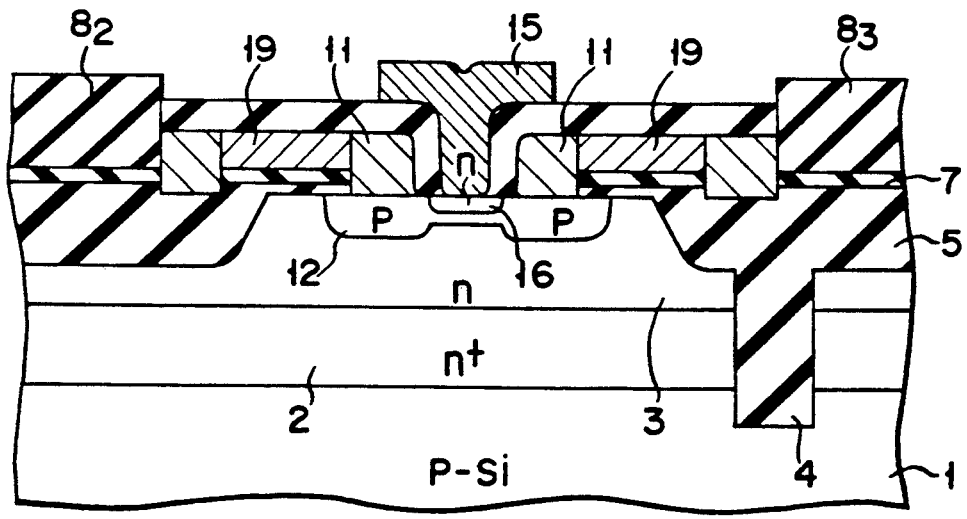

FIGS. 7A and 7B show an embodiment in which the above refractory metal film is used as the first conductive film instead of the polycrystalline silicon film. A state shown in FIG. 7A (corresponding to FIG. 3E) is obtained in the same as in the embodiment of FIGS. 3A to 3H except that the refractory metal film is used as described above. As shown in FIG. 7A, the surface is flattened while refractory metal film 19 serving as the first conductive film is covered with polycrystalline silicon film 11 serving as the second conductive film. Thereafter, a bipolar transistor shown in FIG. 7B is obtained in the same manner as in the embodiment of FIGS. 3A to 3H.

The bipolar transistor obtained in the embodiment of FIGS. 7A and 7B has the following specific advantages. That is, since the refractory metal having a small resistivity is used as a base electrode, a base resistance can be sufficiently reduced, and a high-speed operation can be achieved. In addition, since a contact with external base region 12 is formed through second polycrystalline silicon film 11, junction breakdown caused by electromigration of the refractory metal can be prevented.

However, all the above embodiments have the following problem.

That is, as shown in FIG. 3F, polycrystalline silicon film 11 is in direct contact with nitride film 7. Therefore, if the surfaces of polycrystalline silicon films 9 and 11 is thermally oxidized using film 7 as a mask, oxide film 13 is formed below film 7 as shown in FIG. 3G. In FIG. 3G, it is schematically shown that oxide film 13 is formed thick even at a portion where polycrystalline silicon film 11 and nitride film 7 are in contact with each other because film 7 is pushed upward. However, in certain circumstances, it can occasionally occurs that film 7 is not actually pushed upward so much. For this reason, film 13 formed on the surface of film 11 at a portion contacting film 7 possibly becomes very thin. In such circumstances, when a bipolar transistor having a structure shown in FIG. 3H is completed, a sufficient distance cannot be assured between external base region 12 and emitter region 16. Therefore, regions 12 and 16 each of which is a high-impurity region are formed close to each other, and in the worst case, they are brought into contact with each other to form a concentrate p-n junction. This significantly reduces a base/emitter junction breakdown voltage and increases a junction capacitor, thereby degrading the high-speed operation characteristics.

Referring to FIGS. 8A to 8I, still another embodiment capable of solving the above problem.

First, a state shown in FIG. 8A is obtained in the same manner as in the embodiment of FIGS. 3A to 3H. Note that the thickness of thermal oxide film 6 is about 500 Å, that of nitride film 7 is about 1,500 Å, and that of CVD oxide film 8 is about 6,000 Å.

Then, film 8 is patterned by photolithography to leave oxide film patterns $8_1$ to $8_3$ on an internal base region prospective portion and an element isolation region (FIG. 8B). At this time, film 7 is patterned using the same etching mask so as to be left below only patterns $8_1$ to $8_3$. In this point, this embodiment differs from the above embodiments. Film 6 located below film 7 may be simultaneously etched.

Then, CVD oxide film 20 having a film thickness of about 3,000 Å is deposited on the entire surface to obtain a structure of FIG. 8C. This step is not included in the above embodiments and hence is the characteristic feature of this embodiment.

Then, a structure of FIG. 8D is obtained in the same manner as in the above embodiments. In FIG. 8D, reference numeral 9 denotes a polycrystalline silicon film; and 10, a photoresist pattern.

Then, film 9 is etched by RIE using pattern 10 as a mask to expose CVD oxide film 20. Subsequently, RIE is continuously performed using pattern 10 and film 20 as masks to completely etch film 9. RIE is continuously performed to expose a prospective base region, and then pattern 10 is removed, thereby obtaining a state of FIG. 8E. At this stage, side walls of a stacked film pattern of films 8 and 7 are covered with film 20.

Figure 8E:
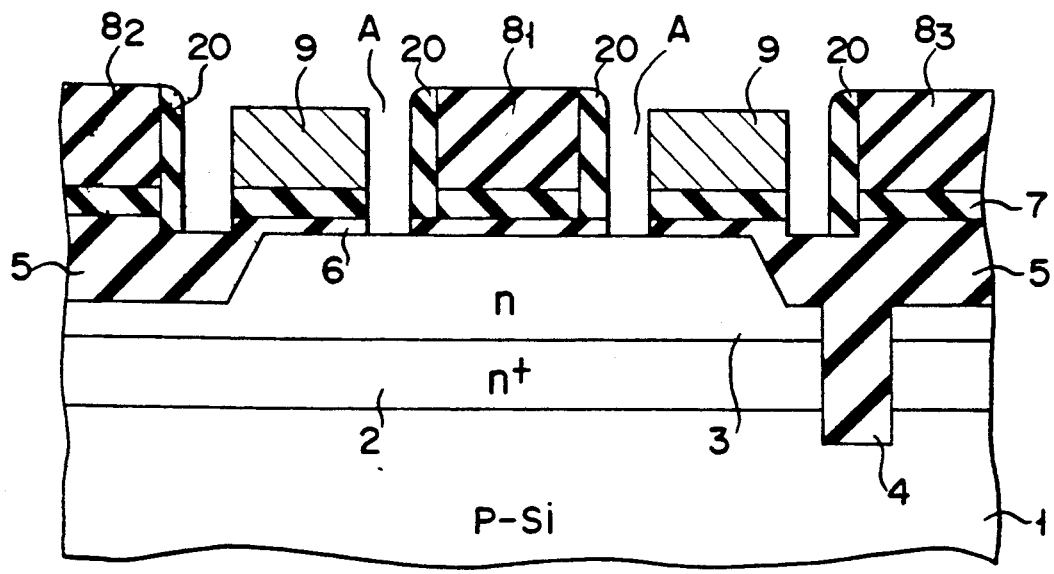
Figure 8F:
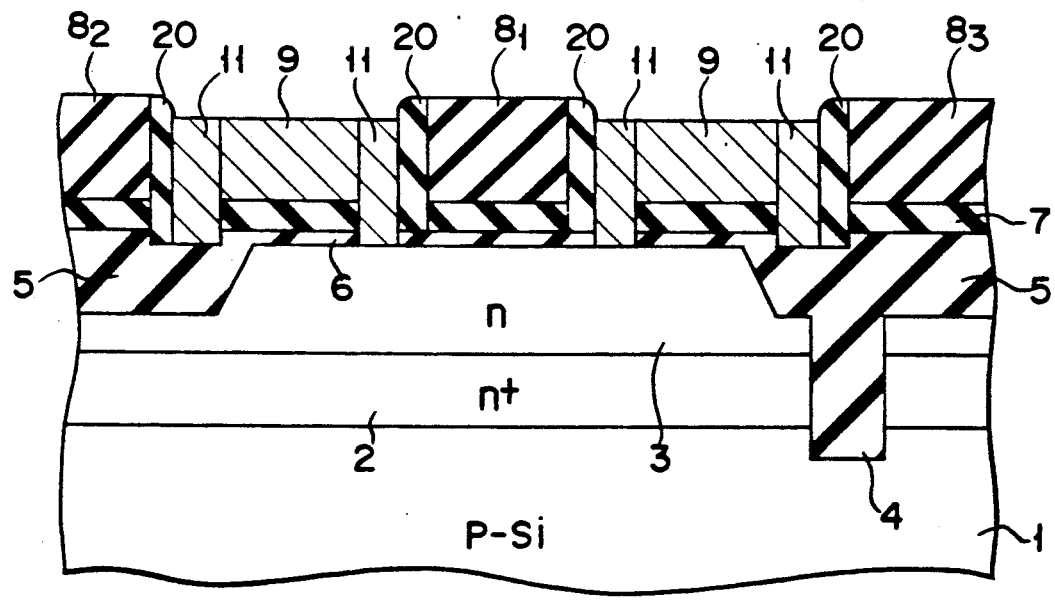

Then, as shown in FIG. 8F, second polycrystalline silicon film 11 is buried in first opening A in the same manner as in the above embodiments.

Thereafter, oxide film pattern $8_1$, film 20 on the side wall of pattern $8_1$ and a part of thermal oxide film 6 under the film 20 are removed by etching, thereby forming second opening B for forming an internal base region as shown in FIG. 8G. As shown in FIG. 8G, second polycrystalline silicon film 11 is spaced apart from nitride film 7 by a distance corresponding to the film thickness of CVD oxide film 20 which is removed by etching. In this embodiment, this is the most important point.

Then, thermal oxidation is performed using film 7 as an anti-oxidation mask to form oxide film 13 on the surfaces of films 9 and 11 (FIG. 8H). As shown in FIG. 8H, oxide film 13 covering side walls of polycrystalline silicon film 11 is sufficiently thick even at a portion contacting nitride film 7. This is because films 7 and 11 are spaced apart from each other so that film 7 does not interrupt growth of film 13, as shown in FIG. 8G. As a result, oxide film 13 having a sufficient thickness is formed even at a portion close to substrate 1. This is an advantage of the embodiment.

Figure 8I:
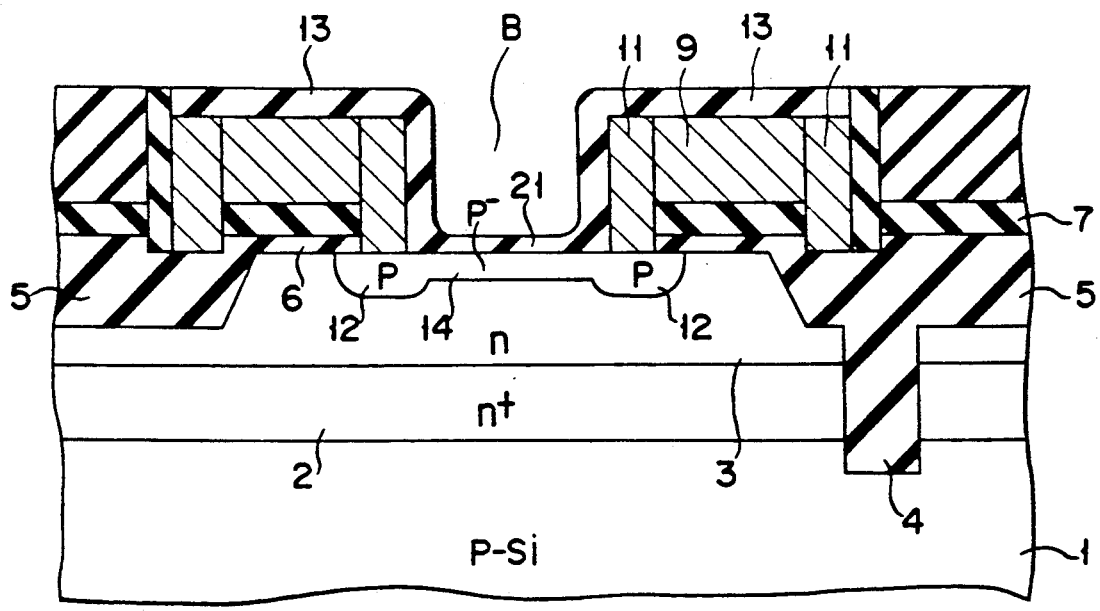
Figure 8J:
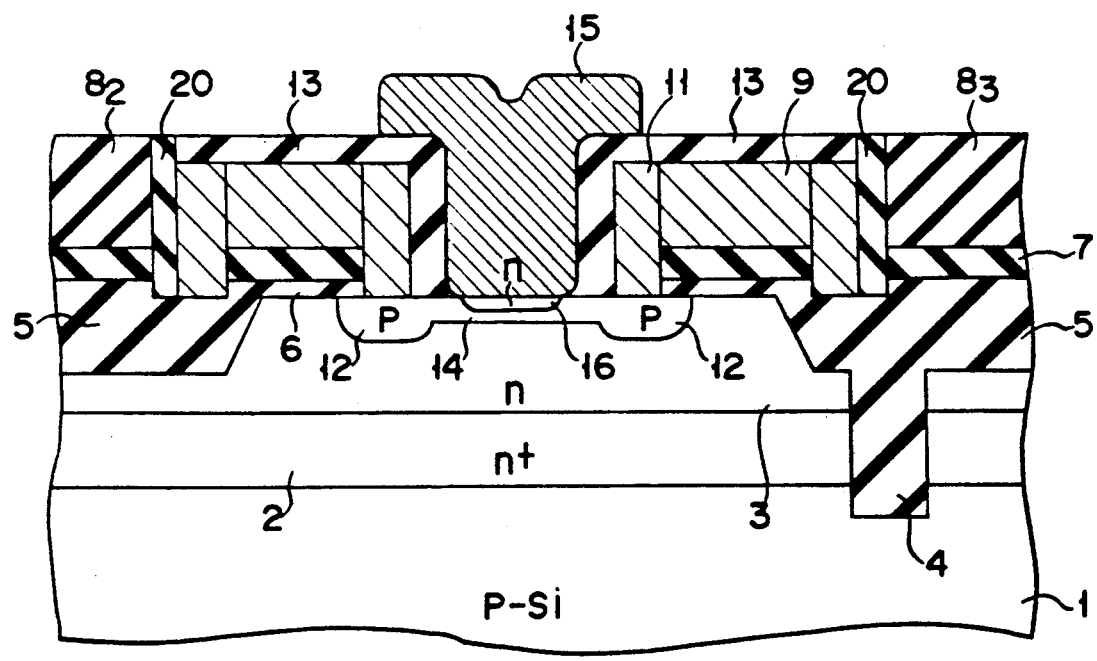

Thereafter, in the same manner as in the above embodiments, films 7 and 6 are removed, and thin oxide film 21 for covering the internal base region is formed. Subsequently, boron is ion-implanted to form p-type internal base region 14 (FIG. 8I). Then, film 21 covering the internal base region is removed to form an emitter diffusion window, and third polycrystalline silicon film 15 doped with arsenic at a high concentration is deposited and patterned into a shape of an emitter electrode. The resultant structure is annealed to diffuse the arsenic from film 15 into the wafer to form n-type emitter region 16 (FIG. 8J). At this time, since the emitter diffusion window and the external base region are spaced apart from each other by film 13 having a sufficient thickness, a p-n junction is prevented from being formed between emitter region 16 and external base region 12.

According to the embodiment shown in FIGS. 8A to 8J, since junction is not formed between high-concentration regions, i.e., between external base region 12 and emitter region 16, reduction in the junction breakdown voltage can be prevented. In addition, a base/emitter oxide film capacitance can be sufficiently reduced. Therefore, a bipolar transistor having good high-frequency characteristics can be manufactured.

As has been described above, according to the present invention, the base and emitter regions are formed completely by self alignment. In addition, the width of the external base region can be easily and accurately controlled by controlling the film thickness of the first conductive film serving as a part of the base electrode or by interposing the spacer film. Furthermore, since the wafer surface need not be etched as in the conventional method in which an overhang is formed, the base or emitter region is not damaged in element manufacturing steps. Therefore, a high-performance bipolar transistor having various excellent characteristics such as a junction breakdown voltage and a cut-off frequency with small variations is obtained. When the bipolar transistor according to the present invention is applied to ICs, a high packing density is achieved, and high reliability and high manufacturing yield are obtained.

What is claimed is:

1. A method of manufacturing a bipolar transistor, comprising the steps of:
   a) forming an anti-oxidation film on a semiconductor wafer having a collector region of a first conductivity type, and stacking an insulating film for step forming on said anti-oxidation film;
   b) patterning stacked films consisting of said anti-oxidation film and said insulating film for step forming to form a stacked film pattern covering an internal base region prospective portion;

c) depositing a first mask material film on the entire surface;

d) depositing a conductive material on the surface to cover said first mask material film, thereby forming a first conductive film used as a part of a base electrode;

e) burying a second mask material film pattern in a recess on the surface of said first conductive film;

f) selectively etching said first conductive film using said second mask material film pattern as an etching mask t expose said first mask material film on said stacked film pattern;

g) completely, selectively etching said first conductive film by anistropic etching using said exposed first mask material film and said second mask material film patterns as etching masks, and exposing the surface of said collector region, thereby forming a first opening for forming an external base region between said two mask material film patterns;

h) removing said second mask material film pattern;

i) burying a second conductive film doped with an impurity of the first conductivity type serving as a base electrode in said first opening;

j) removing first mask material film left on the side wall of said stacked film pattern and said insulating film for step forming which constitutes said stacked film pattern thereby forming a second opening for forming an internal base region;

k) performing thermal oxidation using said anti-oxidation film left in step j) to form a thermal oxide film on a surface of said second conductive film, and diffusing the impurity contained in said second conductive film into said collector region, thereby forming said external base region of a second conductivity type;

l) doping an impurity of the second conductivity type into said wafer through said second opening, thereby forming an emitter region of the second conductivity type;

m) exposing the wafer surface through said second opening, and depositing a third conductive film serving as a part of an emitter electrode; and n) diffusing an impurity of the first conductivity type from said third conductive film in said wafer to form an emitter region of the first conductivity type.

2. A method according to claim 1, wherein each of said first to third conductive films comprises of a polycrystalline silicon film.

3. A method according to claim 1, wherein said anti-oxidation film comprises of a silicon nitride film.

4. A method according to claim 1, wherein a buffer oxide film is interposed between said silicon nitride film and said semiconductor wafer.

5. A method according to claim 1, wherein said internal base region is formed by ion implantation before said third conductive film is formed.

6. A method of manufacturing a bipolar transistor, comprising the steps of:

a) forming an anti-oxidation film on a semiconductor wafer having a collector region of a first conductivity type, and stacking an insulating film for step forming on said anti-oxidation film;

b) patterning stacked films consisting of said anti-oxidation film and said insulating film for step forming to form a stacked film pattern covering an internal base region prospective portion;

c) depositing a first mask material film on the entire surface;

d) depositing a conductive material on the surface to cover said first mask material film, thereby forming a first conductive film used as a part of a base electrode;

e) burying a second mask material film pattern in a recess on the surface of said first conductive film;

f) selectively etching said first conductive film using said second mask material film pattern as an etching mask t expose said first mask material film on said stacked film pattern;

g) completely, selectively etching said first conductive film by anistropic etching using said exposed first mask material film and said second mask material film patterns as etching masks, and exposing the surface of said collector region, thereby forming a first opening for forming an external base region between said two mask material film patterns;

h) removing said second mask material film pattern;

i) burying a second conductive film doped with an impurity of the first conductivity type serving as a base electrode in said first opening;

j) removing said insulating film for step forming which constitutes said stacked film pattern thereby forming a second opening for forming an internal base region, said first mask material film being remained on the side wall of said stacked film pattern;

k) performing thermal oxidation using said anti-oxidation film left in step j) to form a thermal oxide film on a surface of said second conductive film, and diffusing the impurity contained in said second conductive film into said collector region, thereby forming said external base region of a second conductivity type;

l) doping an impurity of the second conductivity type into said wafer through said second opening, thereby forming an emitter region of the second conductivity type;

m) exposing the wafer surface through said second opening, and depositing a third conductive film serving as a part of an emitter electrode; and n) diffusing an impurity of the first conductivity type from said third conductive film in said wafer to form an emitter region of the first conductivity type.

7. A method according to claim 6, wherein each of said first to third conductive films comprises of a polycrystalline silicon film.

8. A method according to claim 6, wherein said anti-oxidation film comprises of a silicon nitride film.

9. A method according to claim 6, wherein a buffer oxide film is interposed between said silicon nitride film and said semiconductor wafer.

10. A method according to claim 6, wherein said internal base region is formed by ion implantation before said third conductive film is formed.

* * * * *